United States Patent
Kaya et al.

(10) Patent No.: US 12,407,344 B2
(45) Date of Patent: *Sep. 2, 2025

(54) TRANSISTOR SHORT CIRCUIT PROTECTION

(71) Applicant: TEXAS INSTRUMENTS INCORPORATED, Dallas, TX (US)

(72) Inventors: Cetin Kaya, Plano, TX (US); Nathan Richard Schemm, Rowlett, TX (US); Yong Xie, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/645,774

(22) Filed: Apr. 25, 2024

(65) Prior Publication Data

US 2024/0275374 A1    Aug. 15, 2024

Related U.S. Application Data

(63) Continuation of application No. 17/348,521, filed on Jun. 15, 2021, now Pat. No. 12,003,229.

(51) Int. Cl.
| | |
|---|---|
| H02H 7/00 | (2006.01) |
| G01K 7/02 | (2021.01) |
| G01R 1/20 | (2006.01) |
| G01R 19/165 | (2006.01) |
| G05F 1/46 | (2006.01) |
| H03K 5/24 | (2006.01) |
| H03K 17/082 | (2006.01) |

(52) U.S. Cl.
CPC ........ *H03K 17/0822* (2013.01); *G01K 7/02* (2013.01); *G01R 1/203* (2013.01); *G01R 19/16538* (2013.01); *G05F 1/461* (2013.01); *H03K 5/24* (2013.01)

(58) Field of Classification Search
None
See application file for complete search history.

(56) References Cited

U.S. PATENT DOCUMENTS

| | | | |
|---|---|---|---|
| 4,746,854 A | 5/1988 | Baker | |
| 9,739,811 B2 * | 8/2017 | Zhang | G01R 19/16571 |
| 11,356,114 B2 * | 6/2022 | Wang | H03M 1/785 |
| 12,003,229 B2 * | 6/2024 | Kaya | G01R 31/3277 |
| 2006/0006928 A1 * | 1/2006 | Utsuno | G09G 3/3688 |
| | | | 327/541 |
| 2006/0022648 A1 | 2/2006 | Ben-Yaakov | |
| 2012/0206047 A1 | 8/2012 | Vos | |
| 2013/0099697 A1 * | 4/2013 | Chen | G09G 3/342 |
| | | | 315/294 |
| 2014/0176120 A1 | 6/2014 | Aerts | |

* cited by examiner

*Primary Examiner* — Stephen W Jackson
(74) *Attorney, Agent, or Firm* — Valerie M. Davis; Frank D. Cimino

(57) ABSTRACT

A short circuit detection circuit includes a current terminal, a sense resistor, an amplifier, and a resistor-capacitor ladder. The sense resistor is coupled to the current terminal, and is configured to develop a sense voltage proportional to a current through the current terminal. The amplifier is coupled to the sense resistor, and is configured to generate a scaled current proportional to the sense voltage. The resistor-capacitor ladder is coupled to the amplifier, and is configured to generate a measurement voltage that represents a surface temperature rise due to the current through the current terminal.

20 Claims, 3 Drawing Sheets

TRANSISTOR SHORT CIRCUIT PROTECTION

CROSS-REFERENCE TO RELATED APPLICATIONS

This application is a continuation of U.S. application Ser. No. 17/348,521, filed Jun. 15, 2021, the entirety of which is incorporated herein by reference.

BACKGROUND

Transistors, such as metal oxide semiconductor (MOS) transistors, are used as power switches in various applications. In some applications, transistors are stacked in series between two power supply rails. This arrangement is referred to as half-bridge configuration. If a short circuit develops between the two power rails through the stacked transistors, one or both of the transistors may be damaged.

SUMMARY

A short-circuit detection circuit that identifies a short-circuit condition based on estimated die temperature is described herein. In one example, a short circuit detection circuit includes a current terminal, a sense resistor, an amplifier, and a resistor-capacitor ladder circuit. The sense resistor includes a first terminal coupled to the current terminal, and a second terminal. The amplifier includes a first input coupled to the first terminal of the sense resistor, a second input coupled to the second terminal of the sense resistor, and an output. The resistor-capacitor ladder circuit includes an input coupled to the output of the amplifier.

In another example, a short circuit detection circuit includes a current terminal, a sense resistor, an amplifier, and a resistor-capacitor ladder. The sense resistor is coupled to the current terminal, and is configured to develop a sense voltage proportional to a current through the current terminal. The amplifier is coupled to the sense resistor, and is configured to generate a scaled current proportional to the sense voltage. The resistor-capacitor ladder is coupled to the amplifier, and is configured to generate a measurement voltage that represents a surface temperature rise due to the current through the current terminal.

In a further example, a circuit includes a switching transistor, a sense transistor, a sense resistor, an amplifier, and a resistor-capacitor ladder circuit. The switching transistor includes a current terminal, and a control terminal. The sense transistor includes a first current terminal, a second current terminal, and a control terminal. The first current terminal is coupled to the current terminal of the switching transistor. The control terminal is coupled to the control terminal of the switching transistor. The sense resistor includes a first terminal and a second terminal. The first terminal of the sense resistor is coupled to the second current terminal of the sense transistor. The amplifier includes a first input, a second input, and an output. The first input is coupled to the first terminal of the sense resistor. The second input is coupled to the second input of the sense resistor. The resistor-capacitor ladder circuit includes an input coupled to the output of the amplifier.

DETAILED DESCRIPTION

Protecting low resistance transistors against shorts has become increasing difficult. Short circuit currents may be high (e.g., in the range of 500 amperes) and to prevent damage transistors should be protected across all slew rates. Overcurrent detection circuitry may be provided to monitor current flow through transistors, and trigger protection when an overcurrent condition is detected. Conventional overcurrent detection circuitry measures current flow through a transistor, and compares the measured current to a threshold to identify an overcurrent condition. Because of transients generated during transistor switching, conventional overcurrent detection may be blanked out (ignored) until switching is complete and the transistor output has settled. After the transistor output has settled, if the measured current exceeds the threshold, an overcurrent condition is deemed to exist. However, the time (blanking time) during which overcurrent detection is disabled may be too long or too short given process and slew rate variation. If the blanking time is too long, and an overcurrent or short circuit condition exists, the transistor may be damaged. If the blanking time is too short, false detection of an overcurrent condition may occur.

The short circuit detection circuit described herein detects a short circuit condition during transistor switching (during blanking time) by estimating the surface temperature of the switching transistor. The surface temperature of the transistor increases with current flow (energy dissipation across the transistor), and if the estimated surface temperature exceeds a threshold value, then a short circuit condition is deemed to exist. The short circuit detection circuit measures current flow through a switching transistor via a sense transistor. A high bandwidth amplifier converts the current flowing through the sense transistor to a scaled current in a low voltage domain. The scaled current is applied to a resistor-capacitor (R-C) ladder circuit that models a surface portion of the semiconductor material of the switching transistor. When the voltage across the R-C ladder circuit exceeds a threshold, indicating a die surface temperature greater than a predetermined temperature, a short circuit condition is deemed to exist, and the switching transistor may be turned off to prevent damage.

Figure 1:
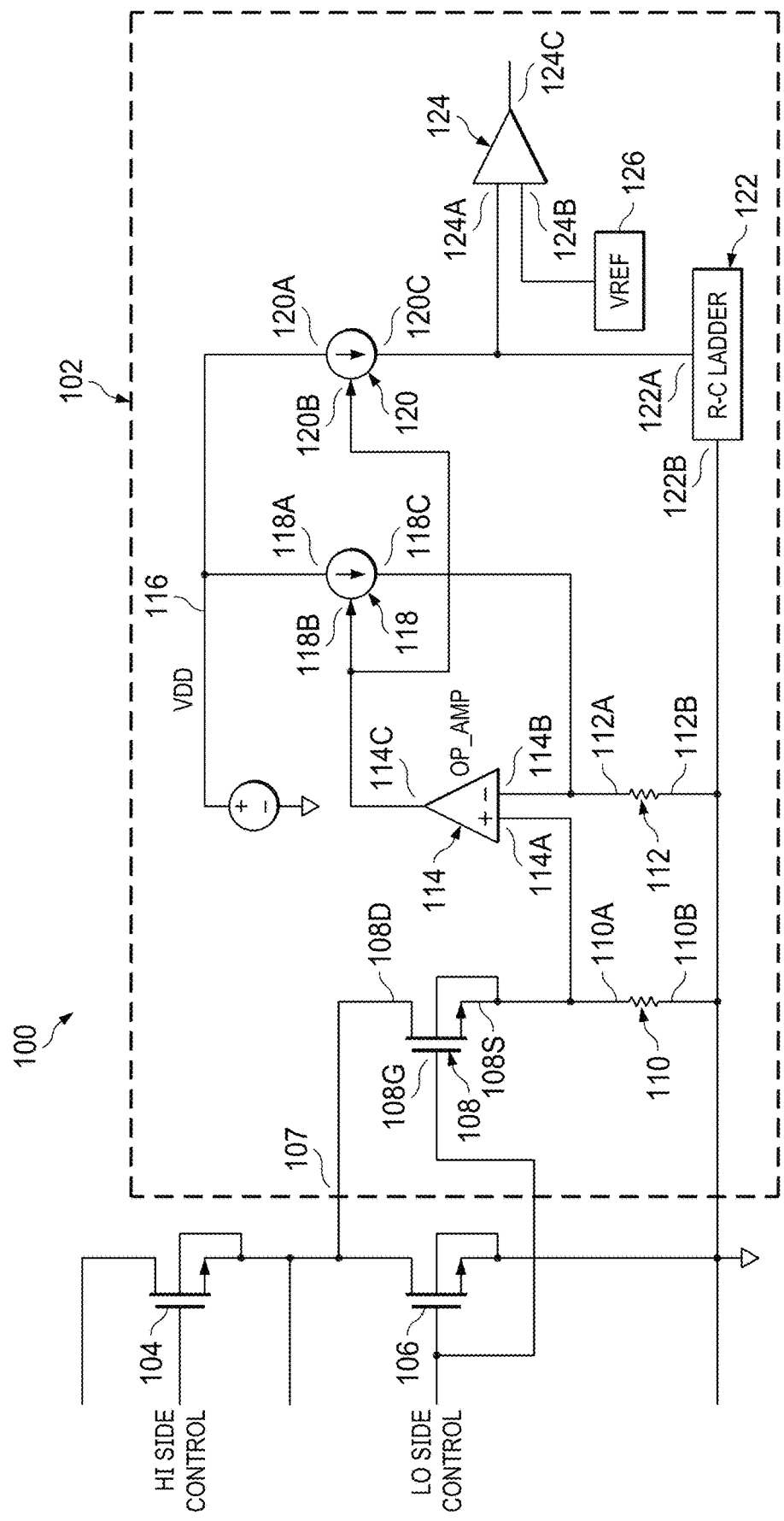
FIG. 1 is a block diagram for an example short circuit detection circuit that detects a short-circuit condition based on estimation of surface temperature.

FIG. 1 is a block diagram for an example circuit 100 that includes short circuit detection based on estimated surface temperature of a switching transistor. The circuit 100 includes a short circuit detection circuit 102, a high-side transistor 104, and a low-side transistor 106. The high-side transistor 104 and the low-side transistor 106 are connected in a half-bridge configuration. The high-side transistor 104 and the low-side transistor 106 may be switching transistors of a DC-DC converter, an inverter, a power factor correction circuit, or any other circuit that implements stacked transistors.

The high-side transistor 104 and the low-side transistor 106 are illustrated as n-type field effect transistors. The high-side transistor 104 may be a p-type field effect transistor in some implementations of the circuit 100. The high-side transistor 104 and the low-side transistor 106 may be gallium nitride (GaN) high electron mobility transistors (HEMTs). In FIG. 1, a drain of the high-side transistor 104 is coupled to a power supply terminal, and source of the high-side transistor 104 is coupled to a drain of the low-side transistor 106. A source of the low-side transistor 106 is coupled to ground. The gate of the high-side transistor 104 and the gate of the low-side transistor 106 are coupled to a control circuit or a control terminal (not shown) that provides a high-side control signal to the high-side transistor 104 and the low-side control signal for turning the high-side transistor 104 and the low-side transistor 106 on or off.

The short circuit detection circuit 102 is coupled to a switching node (a current node 107) formed at the connection of the high-side transistor 104 (e.g., the source of the high-side transistor 104) to the low-side transistor 106 (the drain of the low-side transistor 106). The short circuit detection circuit 102 estimates the temperature of the surface semiconductor material of the low-side transistor 106 to determine whether a short circuit exists at the current node 107. The short circuit detection circuit 102 includes a sense transistor 108, a sense resistor 110, a resistor 112, an amplifier 114, a current source 118, a current source 120, an R-C ladder circuit 122, and a comparator 124. The sense transistor 108 is a scaled-down replica of the low-side transistor 106, and passes a sense current that is a scaled-down replica (a predetermined fraction) of the current flowing in the current node 107 and the low-side transistor 106. The drain 108D (a current terminal) of the sense transistor 108 is coupled to the current node 107, and the gate 108G (a control terminal) of the sense transistor 108 is coupled to the gate (a control terminal) of the low-side transistor 106.

The sense transistor 108 is coupled to the sense resistor 110, and the sense current flowing through the sense transistor 108 also flows in the sense resistor 110 to develop a sense voltage across the sense resistor 110. A terminal 110A of the sense resistor 110 is coupled to the source terminal 108S (a current terminal) of the sense transistor 108, and terminal 110B of the sense resistor 110 is coupled to ground.

The sense resistor 110 is coupled to the amplifier 114. The amplifier 114 scales the voltage across the amplifier 114 to generate a scaled current that is proportional to the sense voltage. A first input of the amplifier 114 is coupled to the terminal 110A of the sense resistor 110, and a second input 114B of the amplifier 114 is coupled to ground via the resistor 112. A terminal 112B of the resistor 112 is coupled to ground, and a terminal 112A of the resistor 112 is coupled to the input 114B of the amplifier 114.

The output signal of the amplifier 114 controls the current source 118 and the current source 120. The output 114C of the amplifier 114 is coupled to the control input 118B of the current source 118 and the control input 120B of the current source 120. The current source 118 produces, based on the output signal of the amplifier 114, a scaled current (a feedback current) that is fed back to the input 114B of the amplifier 114. The output 118C of the current source 118 is coupled to the input 114B of the amplifier 114.

The current source 120 produces, based on the output signal of the amplifier 114, a scaled current that provided to the R-C ladder circuit 122. While the high-side transistor 104, the low-side transistor 106, and the sense transistor 108 may operate in a high voltage domain (e.g., hundreds of volts), the amplifier 114, the current sources 118 and 120, the R-C ladder circuit 122, and the comparator 124 operate in a low voltage domain (e.g., 5 volts or less). Accordingly, the output currents of the current source 118 and the current source 120 are provided in the low voltage domain. The power input 118A of the current source 118 and the power input 120A of the current source 120 are coupled a power supply terminal 116 (a low voltage power supply terminal).

The comparator 124 is coupled to the R-C ladder circuit 122 and compares the voltage dropped across the R-C ladder circuit 122 to a threshold voltage. The voltage across the R-C ladder circuit 122 represents an estimate of the surface temperature of the semiconductor material of the low-side transistor 106. Thus, the voltage across the R-C ladder circuit 122 increases with the current flowing in the sense transistor 108 as the surface temperature of the semiconductor material of the low-side transistor 106 increases with the current flowing in the sense transistor 108. An input 124A of the comparator 124 is coupled to the output 120C of the current source 120 and the input 122A of the R-C ladder circuit 122 for receipt of an estimated temperature signal (a measurement voltage) developed across the R-C ladder circuit 122. An input 124B of the comparator 124 is coupled to a reference voltage source 126 for receipt of a reference voltage representing a short circuit temperature threshold. The reference voltage may represent a surface temperature of approximately 200° Celsius in some implementations of the short circuit detection circuit 102. An output 124C of the comparator 124 provides a signal indicating detection of a short circuit based on estimated die surface temperature.

Figure 2:
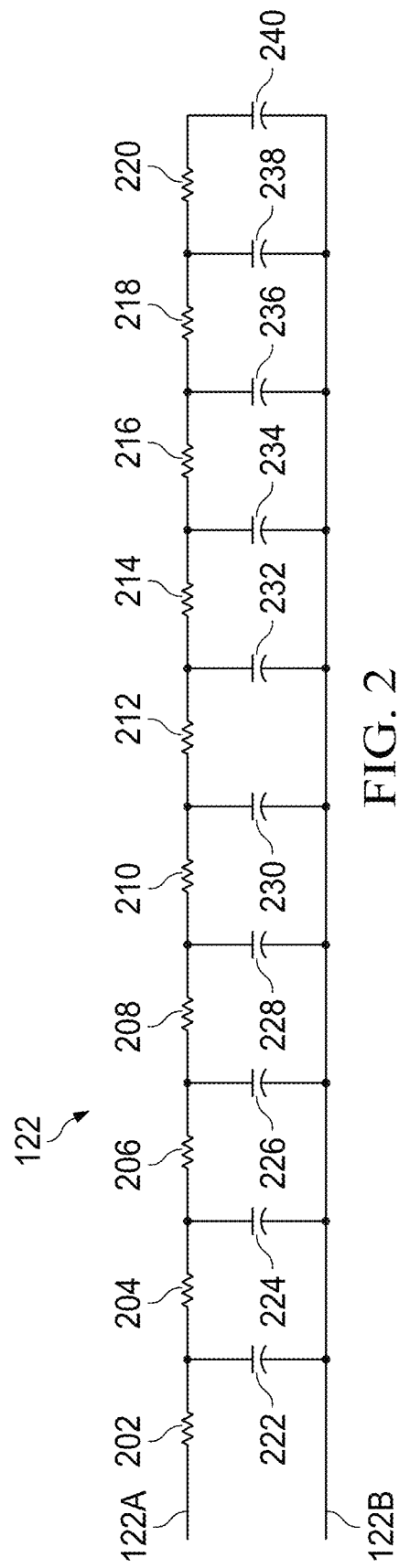
FIG. 2 is a schematic diagram for an example resistor-capacitor (R-C) ladder circuit that models a surface portion of switching transistor semiconductor material.

FIG. 2 is a schematic diagram for an example R-C ladder circuit 122 that models a surface portion of the semiconductor material of the low-side transistor 106. The R-C ladder circuit 122 includes capacitors that form the rungs of the R-C ladder circuit 122, and resistors that are connected in series form the rail of the R-C ladder circuit 122. The resistors emulate the thermal conductivity of the semiconductor material, and the capacitors emulate the thermal capacitance of the semiconductor material. The implementation of the R-C ladder circuit 122 shown in FIG. 2 includes ten rungs. The ten rungs include capacitors 222, 224, 226, 228, 230, 232, 234, 236, 238, and 240. Each capacitor may have a capacitance of about 3.2 picofarads in some implementations of the R-C ladder circuit 122. The rail of the R-C ladder circuit 122 includes resistors 202, 204, 206, 208, 210, 212, 214, 216, 218, 220, and 221. The resistor 202 may have a resistance of about 2.6 kilohms, and the resistors 204-220 may each have a value of about 5.2 kilohms in some implementations of the R-C ladder circuit 122. The resistor 202 at one end of the rail is coupled to the input 122A, and the resistor 221 at the other end of the rail is coupled to the input 122B. The input 122B is coupled to ground.

A bottom plate terminal of each capacitor is coupled to the input 122B of the R-C ladder circuit 122. A top plate terminal of each capacitor is coupled to at least one of the resistors of the rail. For example, the top plate terminal of the capacitor 222 is coupled to the resistor 202 and the resistor 204, the top plate terminal of the capacitor 224 is coupled to the resistor 204 and the resistor 206, etc.

In the R-C ladder circuit 122, each rung emulates the thermal capacitance of approximately one micron of depth of the surface semiconductor material of the low-side transistor 106. Thus, given the ten rungs shown in FIG. 2, the R-C ladder circuit 122 emulates a 10-micron depth of semiconductor material. In short circuit conditions of 200 nanoseconds or less, a heatwave in GaN does not diffuse more than 10 microns. Some implementations of the R-C ladder circuit 122 may include a different number of rungs to represent a different depth of semiconductor material.

Figure 3:
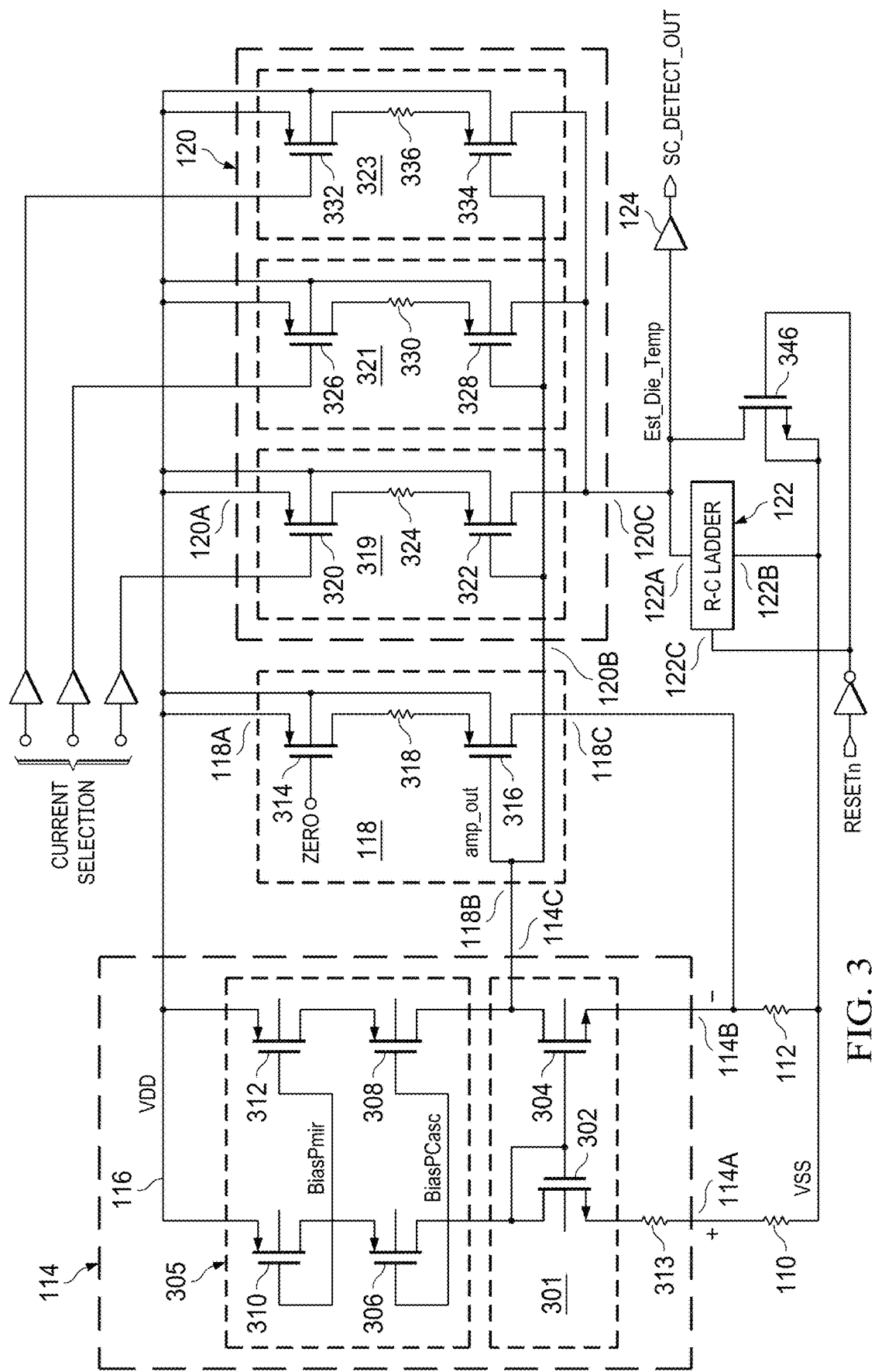
FIG. 3 is a schematic diagram for an example amplifier and current sources of the short circuit detection circuit of FIG. 1.

FIG. 3 is a schematic diagram for examples of the amplifier 114 and current sources 118 and 120 of the short circuit detection circuit 102. The amplifier 114 includes a differential input pair 301 and a bias circuit 305. The differential input pair 301 has common-mode gate configuration, and includes the transistor 302 and the transistor 304. The output 114C of the amplifier 114 is coupled to the drain of the transistor 304. The source of the transistor 304 is coupled to the input 114B. The source of the transistor 302 is coupled to the input 114A via the resistor 313.

The bias circuit 305 sources current to the differential input pair 301, and includes the transistor 306, the transistor 308, the transistor 310, and the transistor 312. The source of the transistor 310 and the source of the transistor 312 are coupled to the power supply terminal 116. The drain of the transistor 310 is coupled to the source of the transistor 306, and the drain of the transistor 312 is coupled to the source of the transistor 308. The drain of the transistor 306 is coupled to the drain of the transistor 302, and the drain of the transistor 308 is coupled to the drain of the transistor 304.

The current source 118 includes a transistor 314, a transistor 316, and a resistor 318. The source of the transistor 314 is coupled to the power supply terminal 116. The gate of the transistor 314 is pulled down such that the transistor 314 is always on. The drain of the transistor 314 is coupled to the source of the transistor 316 via the resistor 318. The gate of the transistor 316 is coupled to the output 114C of the amplifier 114, so that current flow through the transistor 316 is controlled by the output signal of the amplifier 114. The drain of the transistor 316 is coupled to the input 114B of the amplifier 114.

The current source 120 includes selectable current sources 319, 321, and 323. Some implementations of the current source 120 may include a different number of selectable current sources (more or less than three selectable current sources). The current sources 319, 321, and 323 may be individually enabled or disabled via a current selection value. The current selection value may be set at manufacture based on the current rating of the low-side transistor 106. The current source 319 includes a transistor 320, a transistor 322, and a resistor 324. The source of the transistor 320 is coupled to the power supply terminal 116. The gate of the transistor 320 is controlled by the current selection value to enable or disable the current source 319. The drain of the transistor 320 is coupled to the source of the transistor 322 via the resistor 324. The gate of the transistor 322 is coupled to the output 114C of the amplifier 114, so that current flow through the transistor 322 is controlled by the output signal of the amplifier 114. The drain of the transistor 322 is coupled to the output 120C for driving the R-C ladder circuit 122.

The current source 321 includes a transistor 326, a transistor 328, and a resistor 330. The source of the transistor 326 is coupled to the power supply terminal 116. The gate of the transistor 326 is controlled by the current selection value to enable or disable the current source 321. The drain of the transistor 326 is coupled to the source of the transistor 328 via the resistor 330. The gate of the transistor 328 is coupled to the output 114C of the amplifier 114, so that current flow through the transistor 328 is controlled by the output signal of the amplifier 114. The drain of the transistor 328 is coupled to the output 120C for driving the R-C ladder circuit 122.

The current source 323 includes a transistor 332, a transistor 334, and a resistor 336. The source of the transistor 332 is coupled to the power supply terminal 116. The gate of the transistor 332 is controlled by the current selection value to enable or disable the current source 323. The drain of the transistor 332 is coupled to the source of the transistor 334 via the resistor 336. The gate of the transistor 334 is coupled to the output 114C of the amplifier 114, so that current flow through the transistor 334 is controlled by the output signal of the amplifier 114. The drain of the transistor 334 is coupled to the output 120C for driving the R-C ladder circuit 122.

In FIG. 3, the R-C ladder circuit 122 also includes a reset input 122C for receiving a reset signal. The reset signal, when active, discharges the capacitors of the R-C ladder circuit 122 in preparation for a next temperature estimation. The reset signal activates the transistor 346 to pull the input 122A to ground to discharge the capacitors of the R-C ladder circuit 122. The reset signal provided at the reset input 122C may close switches coupled in parallel with one or more of the capacitors of the R-C ladder circuit 122 to discharge the capacitors.

Short circuit detection as described herein with respect to the low-side transistor 106 may also be applied to the high-side transistor 104 by coupling an instance of the short circuit detection circuit 102 across the high-side transistor 104. For example, the drain 108D of the sense transistor 108 may be coupled to the drain of the high-side transistor 104, the gate 108G of the sense transistor may be coupled to the gate of the high-side transistor 104, and the terminal 110B of the sense resistor 110 may be coupled to the source of the high-side transistor 104.

In this description, the term "couple" may cover connections, communications or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Modifications are possible in the described embodiments, and other embodiments are possible, within the scope of the claims.

What is claimed is:
1. A circuit comprising:
a first input terminal;
a second input terminal;
a transistor having a control terminal coupled to the second input terminal, a first current terminal coupled to the first input terminal, and a second current terminal;
a first amplifier having a first input terminal coupled to the second current terminal of the transistor, and an output;
a first current source having a control terminal coupled to the output of the first amplifier, and an output terminal; and
a second amplifier having a first input terminal coupled to the output terminal of the first current source, a second input terminal, and an output terminal.
2. The circuit of claim 1, wherein:
the transistor is a first transistor;
the first input terminal is adapted to be coupled to a current terminal of a second transistor;
the second input terminal is adapted to be coupled to a control terminal of a third transistor; and
the current terminal of the second transistor is coupled to a current terminal of the third transistor.
3. The circuit of claim 2, wherein:
the second input terminal of the second amplifier is coupled to a voltage reference.

4. The circuit of claim 3, wherein:
the voltage reference is capable of corresponding to a temperature of the second transistor.

5. The circuit of claim 1, wherein:
the second current terminal of the transistor is coupled to a first terminal of a resistor.

6. The circuit of claim 1, wherein:
the first amplifier has a second input terminal;
the second input terminal of the first amplifier is coupled to a first terminal of a resistor; and
a second terminal of the resistor is coupled to a ground terminal.

7. The circuit of claim 6, wherein:
the output terminal of the first current source is coupled to the second input terminal of the first amplifier.

8. The circuit of claim 1, further comprising:
a second current source having a control terminal coupled to the output of the first amplifier.

9. The circuit of claim 1, wherein:
the output terminal of the second amplifier is coupled to a resistor-capacitor ladder circuit.

10. The circuit of claim 9, wherein the resistor-capacitor ladder circuit includes:
a first capacitor having a first terminal and a second terminal;
a first resistor having a first terminal and a second terminal coupled to the first terminal of the first capacitor;
a second capacitor having a first terminal and a second terminal; and
a second resistor having a first terminal coupled to the first terminal of the first capacitor and the second terminal of the first resistor, a second terminal of the second resistor coupled to the first terminal of the second capacitor.

11. A circuit comprising:
a transistor;
a first amplifier having an output, the first amplifier coupled to the transistor;
a plurality of current sources coupled to an output of the first amplifier;
a resistor-capacitor ladder circuit coupled to a first current source of the plurality of current sources;
a voltage reference; and
a second amplifier coupled to the voltage reference and the resistor-capacitor ladder circuit, wherein the second amplifier is capable of outputting a signal indicating detection of a short circuit.

12. The circuit of claim 11, wherein the resistor-capacitor ladder circuit includes:
a plurality of rungs, wherein each of the plurality of rungs includes a capacitor.

13. The circuit of claim 12, wherein:
each of the plurality of rungs includes a resistor.

14. The circuit of claim 11, wherein:
the transistor is coupled to a resistor.

15. The circuit of claim 14, wherein:
the first amplifier is capable of receiving a voltage across the resistor; and
the voltage is based on a current through the transistor.

16. The circuit of claim 15, wherein:
the transistor is a first transistor;
the current is a first current;
the first current is proportional to a second current in a second transistor; and
the voltage is based on the first current through the first transistor.

17. A method:
receiving, by a first transistor, a first current;
conducting, by the first transistor, a second current, wherein the second current is proportional to the first current, and wherein the second current is conducted through a resistor to develop a first voltage;
generating, by an amplifier, a first scaled current proportional to the first voltage;
outputting, by the amplifier, the first scaled current to a plurality of current sources;
outputting, by a first one of the plurality of current sources, a second scaled current;
receiving, by a resistor-capacitor ladder circuit, the second scaled current; and
outputting, by a comparator, a signal based on a comparison of a voltage from the resistor-capacitor ladder circuit and a reference voltage.

18. The method of claim 17, further comprising:
outputting, by a second one of the plurality of current sources, a feedback current; and
receiving, by the amplifier, the feedback current.

19. The method of claim 17, wherein:
the signal is capable of indicating a determination of a short circuit.

20. The method of claim 17, further comprising:
outputting, by a second one of the plurality of current sources, a feedback current to the amplifier.

* * * * *